(12) United States Patent
Jung et al.

(10) Patent No.: US 6,172,386 B1
(45) Date of Patent: Jan. 9, 2001

(54) FERROELECTRIC MEMORY DEVICE

(75) Inventors: Dong-Jin Jung, Suwon; Ki-Nam Kim, Ahnyang-shi, both of (KR)

(73) Assignee: Samsung Electronics Co., Ltd., Suwon (KR)

(*) Notice: Under 35 U.S.C. 154(b), the term of this patent shall be extended for 0 days.

(21) Appl. No.: 09/335,699

(22) Filed: Jun. 18, 1999

(30) Foreign Application Priority Data

Jun. 20, 1998 (KR) ................................................ 98-23272

(51) Int. Cl.⁷ ............................... H01L 29/76; H01L 29/94
(52) U.S. Cl. ........................ 257/295; 257/296; 257/303; 257/310
(58) Field of Search ..................... 257/295, 296, 257/303, 306, 310; 438/238, 239, 253, 396

(56) References Cited

U.S. PATENT DOCUMENTS 5,475,248 * 12/1995 Takenaka ............................ 257/295
5,481,490 * 1/1996 Watanabe et al. ................... 438/295

* cited by examiner

*Primary Examiner*—Olik Chaudhuri
*Assistant Examiner*—Hoai Pham
(74) *Attorney, Agent, or Firm*—Eugene M. Lee, Esq.

(57) ABSTRACT

A ferroelectric capacitor with a ferroelectric film having a relatively larger amount of titanium constituent than zinconate constituent improves ferroelectric characteristics. The method for fabricating the ferroelectric capacitor includes the step of performing a heat treatment in an oxygen atmosphere after forming a contact opening in an insulating layer which covers an already formed ferroelectric capacitor. This heat treatment in an oxygen atmosphere can minimize undesirable side effects resulting from a platinum electrode oxidizing the ferroelectric film components.

1 Claim, 6 Drawing Sheets

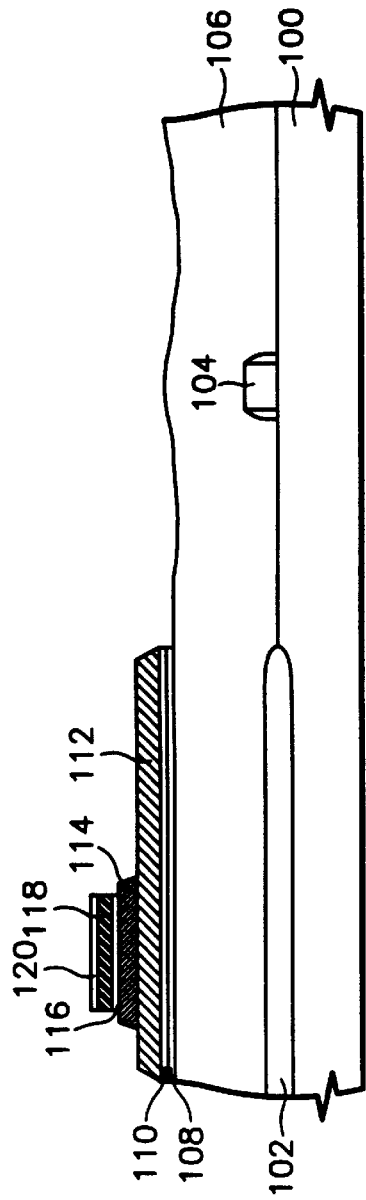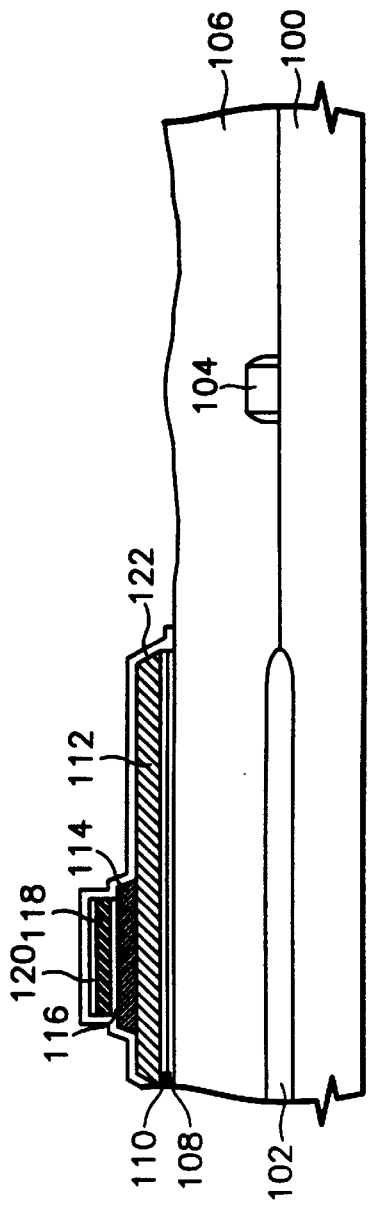

FERROELECTRIC MEMORY DEVICE

BACKGROUND OF THE INVENTION

1. Field of the Invention

The present invention relates generally to a semiconductor device and, more particularly, to a ferroelectric memory device as well as a method of fabrication a ferroelectric memory device.

2. Description of the Related Art

A requirement of modern data processing systems is that a substantial portion of the information stored in memory be randomly accessible to ensure rapid access to such information. Due to the high speed operation of memories implemented in semiconductor technologies, ferroelectric random access memories (FRAMs) have been developed which exhibit a significant advantage of being non-volatile. This non-volatility of FRAMs is achieved by virtue of the fact that a ferroelectric capacitor includes a pair of capacitor plates with a ferroelectric material between them having two different stable polarization states, which can be defined with a hysteresis loop depicted by plotting the polarization against applied voltage.

Recently, the use of such ferroelectric materials has reached commercial applications in the semiconductor industry. Ferroelectric memory elements are non-volatile, are programmable with a low voltage, e.g., less than 5 V, whereas typical flash memories are programmed at 18–22 V, have fast access times on the order of less than a nanosecond, whereas typical flash memories have access times on the order of a micro-second, and are robust with respect to virtually unlimited numbers of read and write cycles. These memory elements also consume low power, less than 1 micro-ampere of standby current, and exhibit radiation hardness.

Ferroelectric materials which have allowed this breakthrough in integrated circuit applications include perovskite structure ferroelectric dielectric compounds, such as lead zirconate titanate $PbZr_xTi_{1-x}O_3$ (PZT), barium strontium titanate (BST), PLZT (lead lanthanum zirconate titanate), and SBT (strontium bismuth tantalum).

In a ferroelectric memory fabrication process, it is a key point to obtain ferroelectric characteristics without any degradations, as well as a one capacitor/one transistor structure and a multi-level metal structure. Particularly in the case of a PZT, the ferroelectric characteristics are directly related to the amounts of perovskite crystalline structure produced by post-deposition annealing. Since a PZT film is formed in a heterogeneous manner, formation of the perovskite crystalline structure by post-deposition annealing is greatly affected by the material in contact therewith, such as capacitor electrodes (i.e., the lower electrode and the upper electrode). In particular, a platinum catalyses reduction reaction easily oxidizes the PZT, thereby causing unacceptable defects in the interface between the electrodes and the PZT as well as causing a deficit in the amount of titanium, which is easily oxidized, in the PZT, and which eventually results in reliability concerns.

SUMMARY OF THE INVENTION

The present invention is directed to overcoming or at least reducing the effects of one or more of the problems set forth above. Accordingly, a method consistent with the present invention provides for fabricating a ferroelectric memory device with improved ferroelectric characteristics, such as high temperature retention and high read/write endurance.

In accordance with one aspect of the invention there is provided a method for fabricating a ferroelectric memory device which includes forming a first insulating layer over a semiconductor substrate. A plurality of running transistors have already been formed on active regions in and on the semiconductor substrate. Each transistor includes a gate electrode with an insulating capping layer and a pair of source/drain regions extending from lateral edges of the gate electrode and within the active region to a predetermined depth.

A ferroelectric capacitor family is formed over the first insulating layer. The ferroelectric capacitor family includes a lower electrode, a ferroelectric film, and an upper electrode in that order from the first insulating layer. An adhesion/barrier layer can be further formed below the lower electrode. The adhesion/barrier layer is made of a material, such as titanium dioxide ($TiO_2$). The lower electrode is made of a multi-layer with a conductive oxide electrode and a platinum electrode. The conductive oxide electrode is made of, for example, iridium dioxide ($IrO_2$), using a DC magnetron sputtering technique. The platinum electrode is used to advantageously provide a favorable crystalline structure for ferroelectric film deposition. Other suitable electrodes may also be used.

The ferroelectric film can be made of PZT (lead zirconate titanium). The resulting PZT ferroelectric film has a relatively larger amount of titanium as compared to zirconate. For example, the composition of titanium to zinconate can be about 3:2, 7:3, or 4:1. The upper electrode can be made of a multi-layer of iridium dioxide and iridium in the order. A photolithographic process is carried out to form the ferroelectric capacitor. After patterning the capacitor, a diffusion barrier layer is formed to cover the ferroelectric capacitor.

The next process sequence is to form an interconnection. A second interlayer insulating layer is formed over the resulting structure. A first opening is formed in the second interlayer insulating layer and the diffusion barrier layer to the lower electrode. To minimize a catalytic effect of the platinum electrode as a reductive agent on the PZT film, a heat treatment can be carried out in an oxygen ambient at about 450° C. through a rapid thermal anneal process or using a furnace. This oxygen ambient heat treatment helps stabilize the iridium dioxide electrode formation, minimize defects at the interface between the ferroelectric film and the lower electrode, and minimize the stress variation of the iridium dioxide electrode. A first reaction barrier layer is formed in the first opening and over the second interlayer insulating layer. A second opening is formed in the barrier layer and the second and first interlayer insulating layers to the source/drain region. A second reaction barrier layer is formed over the resulting structure, and then a main metal layer is deposited thereover.

BRIEF DESCRIPTION OF THE DRAWINGS

These and other features, aspects, and advantages of the present invention will become better understood with regard to the following description, appended claims, and accompanying drawings where:

FIGS. 1A to 1J are cross-sectional views of a semiconductor substrate at selected stages of ferroelectric capacitor process in accordance with the present invention;

DETAILED DESCRIPTION OF THE PREFERRED EMBODIMENTS

A method for fabricating a ferroelectric memory device consistent with the present invention is discussed in detail below. In addition, Korean application no. 98- 23272, filed Jun. 20, 1998, is hereby incorporated by reference as if fully set forth herein.

Figure 1A:
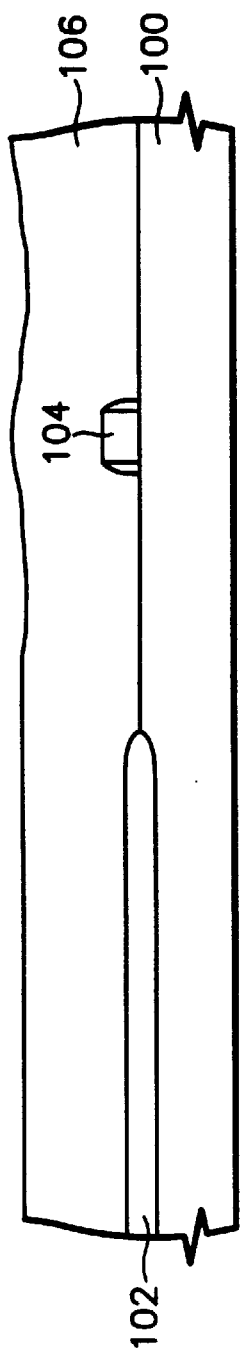

FIGS. 1A to 1J are cross-sectional views of a semiconductor substrate at selected stages of a ferroelectric capacitor fabrication process. Referring to FIG. 1A, there is provided a semiconductor substrate 100 having a transistor 104 formed on an active region thereof and a first insulating layer 106. The active region is surrounded by a device isolation region 102 with a predetermined pattern. The transistor 104 includes a gate electrode with an insulating capping layer and a pair of source/drain regions extending from lateral edges of the gate electrode and within the active region to a predetermined depth.

Figure 1B:
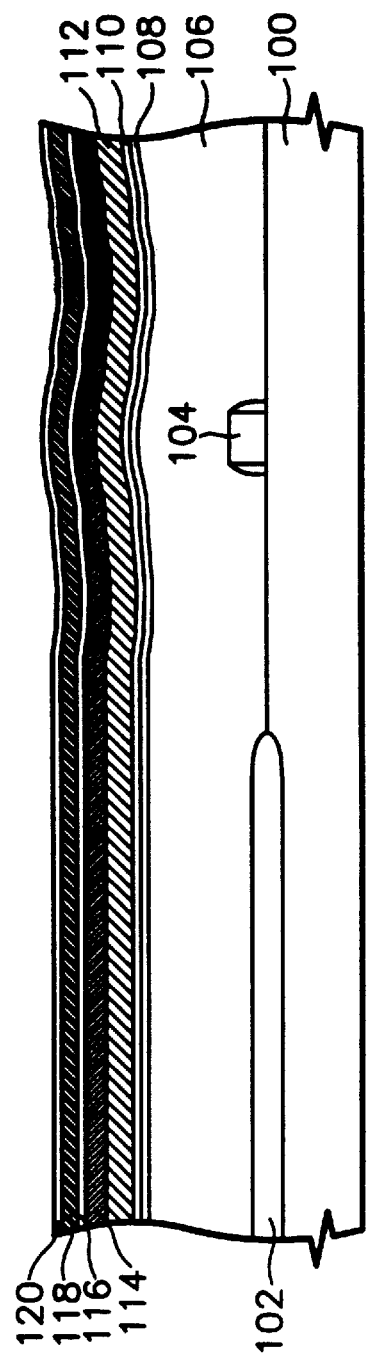

Referring to FIG. 1B, an adhesion/barrier layer 108 is formed over the first insulating layer 106. The adhesion/barrier layer 108 serves to enhance adhesion between the subsequent lower electrode of a ferroelectric capacitor and the first insulating layer 106. It also serves as a barrier layer to prevent diffusion of material. The adhesion/barrier layer 108 is made of a material, such as titanium dioxide ($TiO_2$).

An oxide electrode layer 110 and a platinum electrode layer 112 are sequentially deposited over the adhesion/barrier layer 108 as a lower electrode of the capacitor. The oxide electrode layer 110 can be made of iridium dioxide ($IrO_2$) and formed by a DC magnetron sputtering technique. A heat treatment in an oxygen ambient at about 600° C. can be carried out to intensify the electrode characteristics. A preferable thickness of the oxide electrode layer 110 is about 500 Å. The platinum electrode 112 serves to advantageously provide a favorable crystalline structure for a ferroelectric film deposition and can have a thickness of about 2,700 Å. Other suitable electrodes may be used, as is apparent to those skilled in the art. For example, a single layer of Ir, Rh or Ru can be used instead of a double layer of iridium dioxide and platinum. Further, a double layer structure may include a lower layer formed from a material selected from the group consisting of $IrO_2$, ITO, $RhO_2$, $RuO_2$ and $MoO_3$, and an upper layer formed from a material selected from the group consisting of Pt, Ir, Rh, and Ru.

A ferroelectric film 114 is formed over the electrode layers 110 and 112, and PLZT (lead lanthanum zirconate titanate) or PZT (lead zinconate titanium) can be selected to form the ferroelectric film 114. Formation of the ferroelectric film 114 according to this invention is as follows. A layer of a precursor comprising constituents of a ferroelectric material is deposited in an amorphous form by a sol-gel process. The precursor layer has a relatively larger amount of titanium constituent than zirconate constituent. For example, a composition ratio of titanium to zirconate can be 3:2, 7:3, or 4:1. Post-deposition annealing is carried out to allow for a phase transformation of the as-deposited amorphous form into a crystalline phase, i.e., a perovskite ferroelectric dielectric phase, which has the required ferroelectric dielectric characteristics. The post-annealing can be carried out in oxygen ambient at above 650° C., preferably at about 700° C., through a rapid thermal process or by using a furnace.

A double layer of an oxide electrode layer 116 and a metal electrode layer 118 are sequentially deposited over the ferroelectric film 114 as an upper electrode of the capacitor. Oxide electrode 116 can be made of iridium dioxide ($IrO_2$) and formed by a DC magnetron sputtering technique. A heat treatment can be carried out in an oxygen ambient at about 450° C. to provide a stable oxide conductive electrode layer. A preferable thickness of the oxide electrode layer 110 is about 300 Å. The metal electrode 118 can be made of iridium and can have a thickness of about 1,700 Å. It is apparent to those skilled in the art that other suitable electrodes may also be used. For example, a single layer of Ir, Rh or Ru can be used instead of a double layer of iridium dioxide and platinum. Further, a double layer structure may include a lower layer formed from a material selected from the group consisting of $IrO_2$, ITO, $RhO_2$, $RuO_2$ and $MoO_3$, and an upper layer formed from a material selected from the group consisting of Pt, Ir, Rh, and Ru.

A mask layer 120, formed from a material such as titanium dioxide ($TiO_2$) and having a thickness of about 500 Å, is deposited over the upper electrode layer 118. Through a photolithography process, the mask layer 120 is patterned into a desired configuration. Using this mask pattern, the upper electrode layers 118 and 116 are anisotropically etched by an RIE process to form the upper electrode pattern. Exposed parts of the ferroelectric film 114 are then etched through a photo-etching process. A heat treatment at about 450° C. can be carried out to remove etching damage. After that, the lower electrode layers 112 and 110 and adhesion/barrier layer 108 are sequentially etched through a photo-etching process to form the desired structure shown in FIG. 1C.

A diffusion barrier layer 122 is deposited over the resulting structure shown in FIG. 1C. For example, a titanium dioxide layer ($TiO_2$) can be selected to form such a diffusion barrier layer. A preferable thickness of the diffusion barrier layer 122 is about 500 Å to 1,000 Å. The diffusion barrier layer 122 serves to prevent material in the ferroelectric capacitor from diffusing out. A heat treatment can be carried out in an oxygen ambient at above 650° C. to densify the diffusion barrier layer 122. The deposited diffusion barrier layer 122 is then partially etched to form the ferroelectric structure shown in FIG. 1D.

Figure 1E:
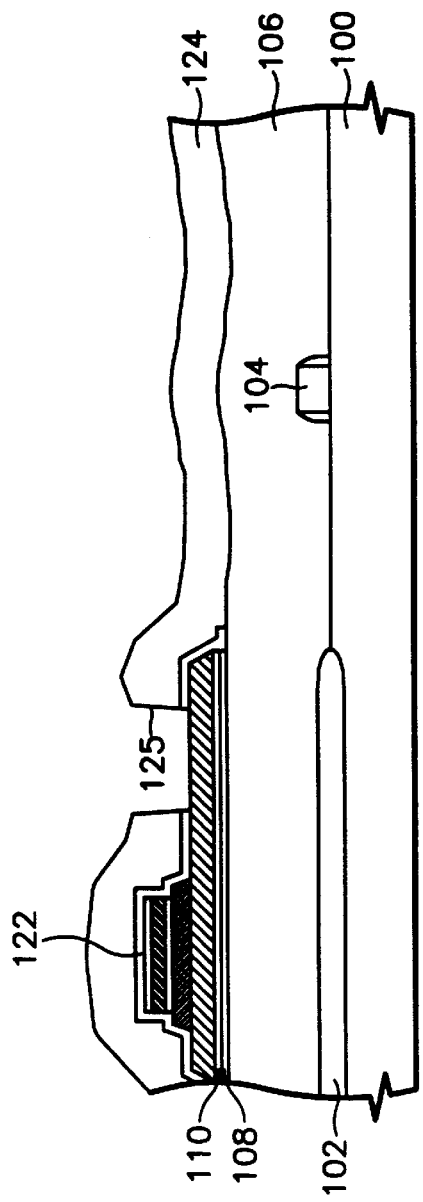

Referring to FIG. 1E, a second insulating layer 124 is conventionally formed over the resulting structure with, for example, a CVD (chemical vapor deposition) process. The second insulating layer 124 and the diffusion barrier layer 122 are sequentially etched to form a first opening to the lower electrode platinum layer 112. The platinum may catalyze the reductive reaction. Such reductant characteristics may oxidize the PZT film and cause defects at the interface between the lower electrode and the PZT film. To minimize this catalytic effect of the platinum electrode as a reductant on the PZT film, a heat treatment is preferably carried out in an oxygen ambient at about 450° C. through a rapid thermal anneal process (RTP) or by using a furnace. Such an oxygen ambient heat treatment helps form a stable lower electrode, i.e., iridium dioxide electrode, minimize defects at the interface between the ferroelectric film (PZT film) and the lower electrode (platinum), and minimize stress variation of the iridium dioxide electrode, which can be produced due to the transformation tendency of iridium dioxide into iridium during an annealing process.

Figure 1F:
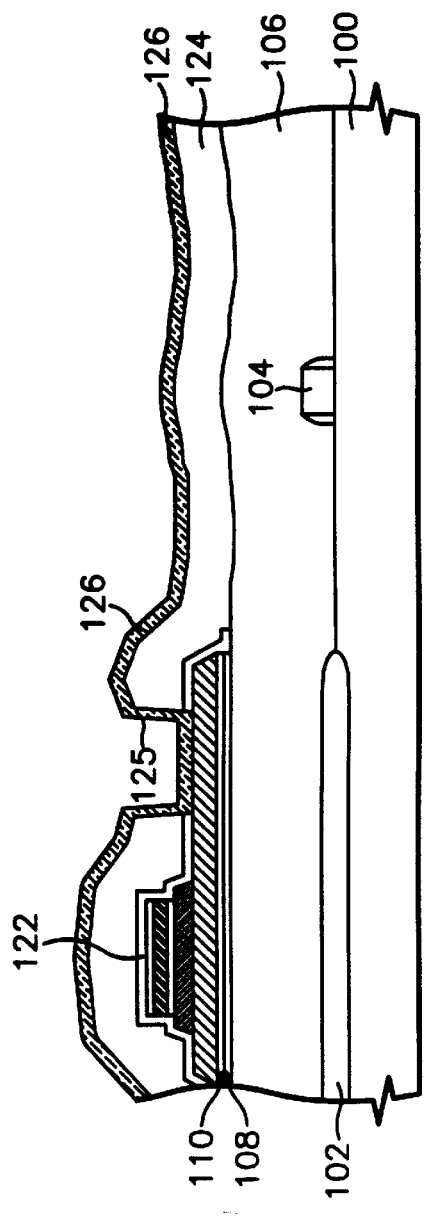
Figure 1G:
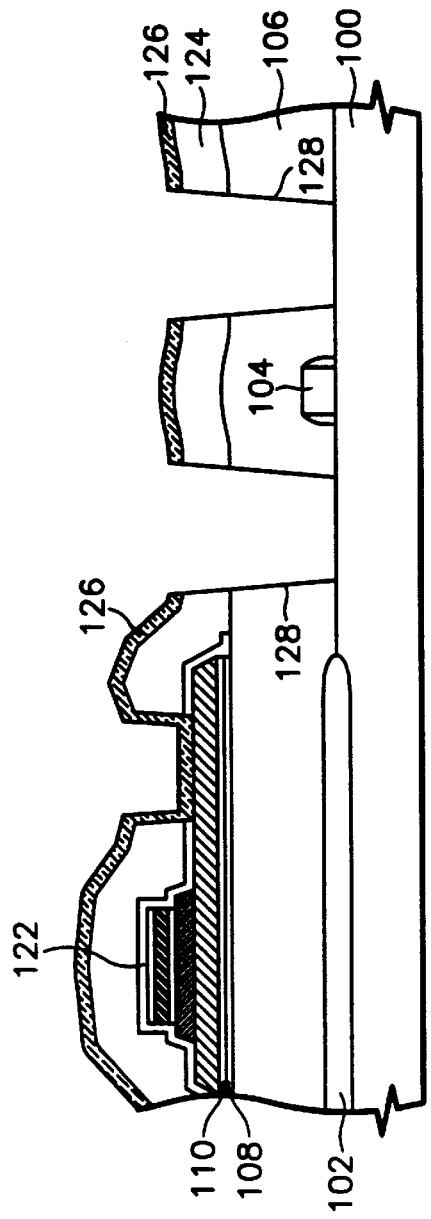

A first reaction barrier layer 126 is formed in the first opening 25 and over the second interlayer insulating layer 124, as shown in FIG. 1F. The first reaction barrier layer 126 can be formed, for example, from titanium nitride to a thickness of about 900 Å. Second openings 128 are formed in the first barrier layer 126 and the second and first interlayer insulating layers 124 and 106 to the source/drain regions, as illustrated in FIG. 1G.

Figure 1H:
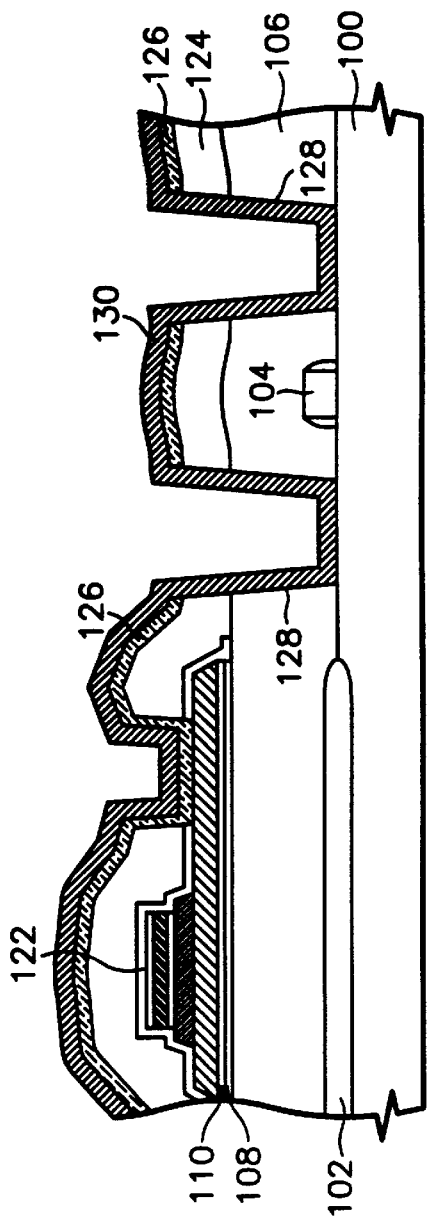
Figure 1I:
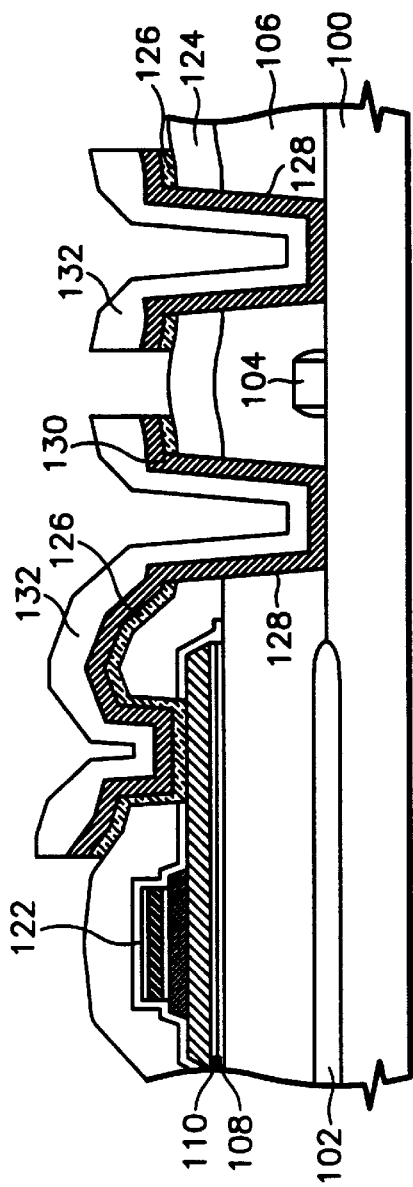

Referring to FIG. 1H, a second reaction barrier layer 130 is formed over the resulting structure. The second reaction barrier layer 130 can made of a double layer structure, such as a titanium layer of about 300 Å and a titanium nitride layer of about 900 Å. Several thousand angstroms of aluminum and 250 Å of titanium nitride are sequentially deposited to form a first metal line 132. Through a well known photo-etching process, the first metal line 132, the second reaction barrier layer 130 and the first barrier layer 126 are patterned to form a contact layer which electrically connects the lower electrode to the source/drain region and simultaneously forms a bit line, as schematically illustrated in FIG. 1I.

Figure 1J:
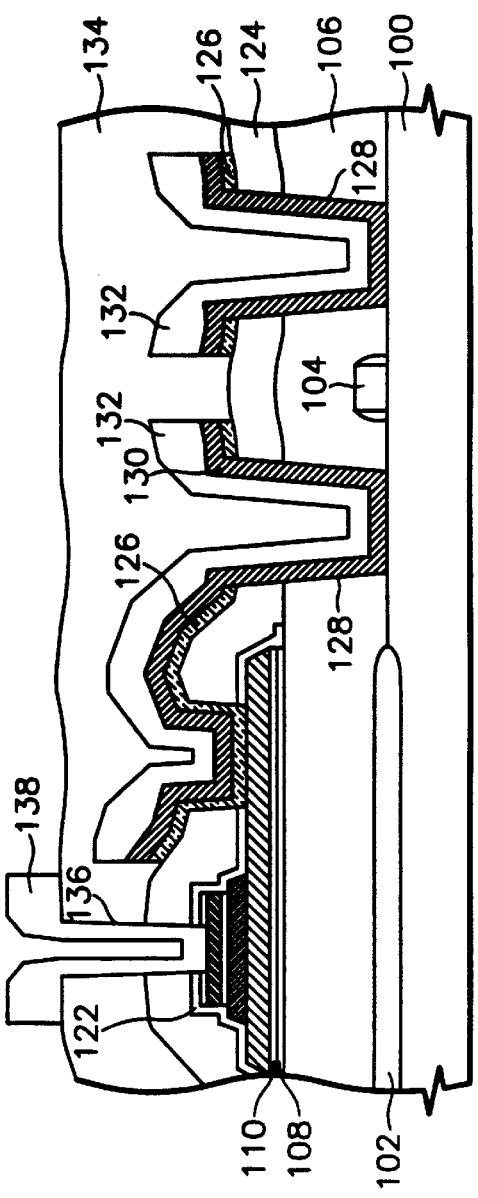

Referring to FIG. 1J, a third insulating layer 134 is deposited over the resulting structure. An ECR (electro cyclotron resonant) oxide layer can be selected to form the third insulating layer 134. An ECR oxide layer can be formed by the process of first depositing an ECR oxide layer to a thickness of about 5,000 Å, planarizing the deposited layer, and re-depositing the ECR oxide layer to a thickness of about 6,500 Å. Alternatively, a TEOS oxide layer formed by a CVD technique can be used to form the third insulating layer 134. The third insulating layer 134, the second insulating layer 124, the diffusion barrier layer 122, and the mask layer 120 are etched to form a third opening 136, which reaches to the upper electrode of the ferroelectric capacitor. Though not shown, another opening exposing the first metal line is formed simultaneously. A heat treatment can be carried out in a nitrogen ambient at about 450° C. to activate the titanium layer in the second opening 128 and the silicon substrate.

The next process sequence is to form a second metal line 138. About 6,000 Å of aluminium and about 250 Å of titanium nitride are sequentially deposited in the third opening 136 and over the third insulating layer 134. Using photolithography, the titanium layers and aluminium layer are etched to form the second metal line 138. About 900 Å of titanium nitride may be further formed before the formation of the aluminium layer. After that, a passivation process is carried out over the resulting structure.

The present invention provides a ferroelectric capacitor with a ferroelectric film having a relatively larger amount of titanium constituent than zirconate constituent so as to improve ferroelectric characteristics. For example, the composition ratio of titanium to zirconate can be 3:2, 7:3, or 4:1. In accordance with the present invention, a hear treatment is preferably carried out after forming a contact opening in an insulating layer to the already formed ferroelectric capacitor so as to improve ferroelectric characteristics.

Figure 2A:
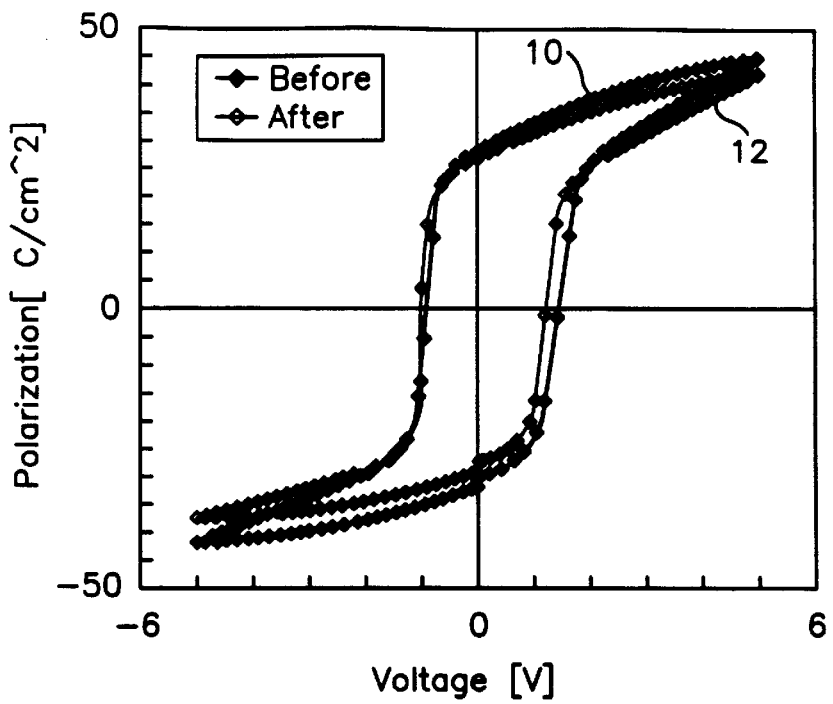
FIG. 2A illustrates a hysteresis loop of a ferroelectric capacitor in accordance with the present invention.

FIG. 2A illustrates a hysteresis loop of a ferroelectric capacitor in accordance with the present invention, before (reference number 10) and after (reference number 12) performing about $10^{10}$ fatigue cycles. As can be seen in FIG. 2A, there is no substantial difference between the initial hysteresis loop (reference number 10) and the hysteresis loop after performing about $10^{10}$ cycles (reference number 12). This means that a ferroelectric capacitor in accordance with the present invention substantially maintains its initial ferroelectric characteristics, even after about $10^{10}$ cycles.

Figure 2B:
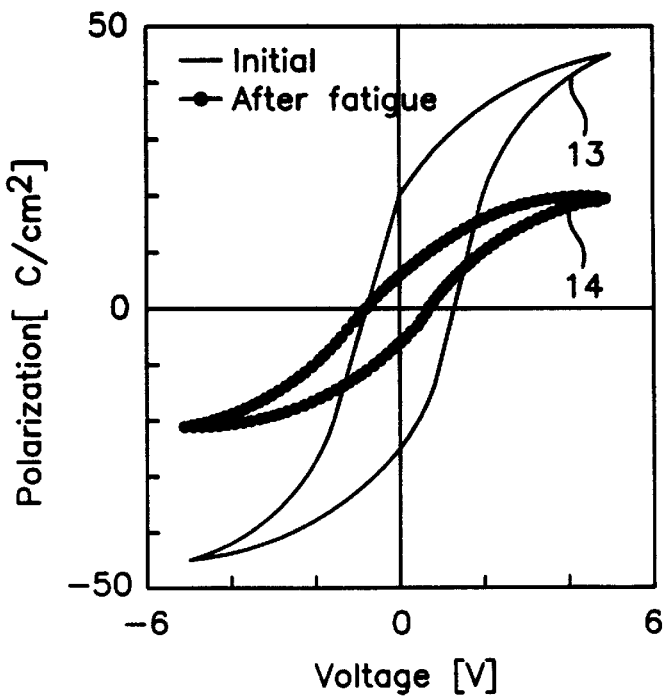
FIG. 2B illustrates a hysteresis loop of a ferroelectric capacitor in accordance with the prior art.

FIG. 2B illustrates a hysteresis loop of a ferroelectric capacitor in accordance with the prior art, and is provided for comparison with the present invention shown in FIG. 2A. It is noted that composition ratio of zirconate to titanium as comprised in the ferroelectric film of the prior art ferroelectric capacitor is 13:12 and a single layer of upper electrode (i.e., platinum) is used. As can be seen, there is a significant variation in the hysteresis loop between the initial phase (see reference number 13) and after about $10^{10}$ fatigue cycles (see reference number 14).

The following Table 1 addresses the advantages of the present invention.

TABLE 1

| Parameter | ferroelectric capacitor shown in FIG. 2A | ferroelectric capacitor shown in FIG. 2B |
|---|---|---|
| Switching at 5V | 70.4 $\mu C/cm^2$ | 63.7 $\mu C/cm^2$ |
| Non-switching at 5V | 16.7 $\mu C/cm^2$ | 32.8 $\mu C/cm^2$ |
| Switching at 3V | 59.1 $\mu C/cm^2$ | 51.8 $\mu C/cm^2$ |
| Non-switching at 3V | 12.1 $\mu C/cm^2$ | 26.5 $\mu C/cm^2$ |
| 2Pr at 5V | 53.7 $\mu C/cm^2$ | 30.9 $\mu C/cm^2$ |
| 2Pr at 3V | 47.0 $\mu C/cm^2$ | 25.3 $\mu C/cm^2$ |
| 2Pr (after fatigue) | 46.4 $\mu C/cm^2$ | 6.8 $\mu C/cm^2$ |
| %, 2Pr | 90.8% | 5.8% or less |

As can be seen in Table 1, switching charge at 5 V and 3 V in accordance with the present invention is significantly high as compared with that of the prior art. Non-switching charge in accordance with the present invention is about two times as high as that of the prior art. As a result, remnant polarization of the present invention is about two times as high as that of the prior art. After about $10^{10}$ fatigue cycles (at ±5 V bipolar pulse, 1 MHz, 50% duty cycle), the present invention has 2Pr of about 46.4 $\mu C/cm^2$ which is 90.8% (=47/6.4×100) of 2Pr before fatigue. On the other hand, the prior art has 2Pr of about 6.8 $\mu C/cm^2$ which is only 5.8% (25.3/6.8×100) of 2Pr before fatigue.

In accordance with the present invention, the ferroelectric capacitor has good ferroelectric characteristics, e.g., robustness with respect to virtually unlimited numbers of read and write cycles and a high remnant polarization.

It will be recognized by those skilled in the art that the innovative concepts disclosed in the present application can be applied in a wide variety of contexts. Moreover, the preferred implementation can be modified in a tremendous variety of ways. Accordingly, it should be understood that the modification and variations suggested below and above are merely illustrative. These examples may help to show some of the scope of the inventive concepts, but these examples do not nearly exhaust the full scope of variation in the disclosed novel concepts. While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives failing within the spirit and scope of the invention as defined in the appended claims.

While the invention is susceptible to various modifications and alternative forms, specific embodiments have been shown by way of example in the drawings and described in detail herein. However, it should be understood that the invention is not limited to the particular forms disclosed. Rather, the invention covers all modifications equivalents, and alternatives falling within the spirit and scope of the invention as defined in the appended claims.

What is claimed is:

1. A ferroelectric memory device comprising:

a transistor formed over an active region of a semiconductor substrate, the transistor having a gate electrode and a source/drain region;

a first insulating layer formed on the transistor and over the semiconductor substrate;

a ferroelectric capacitor formed over the first insulating layer, the ferroelectric capacitor including a lower electrode, a ferroelectric film and an upper electrode, the ferroelectric film being formed from a group including lead zirconate titanium (PZT) and lead lanthanum zirconate titanate (PLZT) where a composition ratio of titanium to zirconate is one of 3:3, 7:3, and 4:1;

a second insulating layer formed on the ferroelectric capacitor and over the first insulating layer;

a first opening formed in the second insulating layer to the lower electrode;

a second opening formed in the second and first insulating layers to the source/drain region;

a first contact layer formed in the first opening and electrically connected to the lower electrode, the first contact layer including a titanium layer and a titanium nitride layer which are sequentially stacked; and a second contact layer formed in the second opening and electrically connected to the source/drain, the second contact layer including a titanium nitride layer, a titanium layer and a titanium nitride layer which are sequentially stacked.

* * * * *

UNITED STATES PATENT AND TRADEMARK OFFICE
CERTIFICATE OF CORRECTION

PATENT NO. : 6,172,386 B1
DATED : January 9, 2001
INVENTOR(S) : Don-Jin Jung et al.

It is certified that error appears in the above-identified patent and that said Letters Patent is hereby corrected as shown below:

Column 7,
Line 9, change "3:3" to -- 3:2 --.

Signed and Sealed this

Fourth Day of March, 2003

JAMES E. ROGAN
*Director of the United States Patent and Trademark Office*